(12) United States Patent
Onodera

(10) Patent No.: US 9,739,822 B2
(45) Date of Patent: Aug. 22, 2017

(54) INPUT CIRCUIT

(71) Applicants: DENSO CORPORATION, Kariya, Aichi-pref. (JP); Advics Co., Ltd., Kariya, Aichi-pref. (JP)

(72) Inventor: Ken Onodera, Nagoya (JP)

(73) Assignees: DENSO CORPORATION, Kariya, Aichi-pref. (JP); ADVICS CO LTD, Kariya (JP)

( * ) Notice: Subject to any disclaimer, the term of this patent is extended or adjusted under 35 U.S.C. 154(b) by 130 days.

(21) Appl. No.: 14/661,291

(22) Filed: Mar. 18, 2015

(65) Prior Publication Data

US 2015/0268289 A1  Sep. 24, 2015

(30) Foreign Application Priority Data

Mar. 19, 2014  (JP) .................................. 2014-056709

(51) Int. Cl.
*G01R 31/3187*  (2006.01)
*G01R 31/02*  (2006.01)

(52) U.S. Cl.
CPC .................... *G01R 31/025* (2013.01)

(58) Field of Classification Search
CPC ............................ G01R 31/025; H03M 1/1076
See application file for complete search history.

(56) References Cited

U.S. PATENT DOCUMENTS

| | | | |
|---|---|---|---|
| 5,254,953 A | 10/1993 | Crook et al. | |
| 6,198,612 B1 * | 3/2001 | Manner ................ | G01R 31/025 324/527 |
| 2005/0184688 A1 | 8/2005 | Hirochi et al. | |
| 2014/0300377 A1 | 10/2014 | Onodera | |

FOREIGN PATENT DOCUMENTS

| | | |
|---|---|---|
| JP | 06-034714 | 2/1994 |
| JP | 10-170583 | 6/1998 |
| JP | 2002-073262 | 3/2002 |
| JP | 2005-245053 | 9/2005 |
| JP | 2014-211436 | 11/2014 |

* cited by examiner

*Primary Examiner* — Daniel Miller
(74) *Attorney, Agent, or Firm* — Harness, Dickey & Pierce, P.L.C.

(57) ABSTRACT

An input circuit has a plurality of input terminals connected to a plurality of input lines transmitting input signals outputted from a plurality of input signal sources. The input circuit includes a controller which outputs a control signal when performing self-diagnosis of a short-circuit fault between the input lines a pulse circuit which generates pulsed self-diagnosis voltage once, twice or more times based on a control signal of the controller a switch which, when performing the self-diagnosis, applies the pulsed self-diagnosis voltage to any one of the input lines based on the control signal of the controller and a comparing/determining section which, when the self-diagnosis voltage is applied to the any one of the input lines, determines whether the short-circuit fault between the input lines has occurred based on voltage variation in the input line different from the input line to which the self-diagnosis voltage is applied.

6 Claims, 8 Drawing Sheets

INPUT CIRCUIT

CROSS-REFERENCE TO RELATED APPLICATION

This application is based on and claims the benefit of priority from earlier Japanese Patent Application No. 2014-056709 filed Mar. 19, 2014, the description of which is incorporated herein by reference.

BACKGROUND

Technical Field

The present invention relates to an input circuit that receives a plurality of input signals.

Related Art

Input circuits that receive a plurality of input signals are well known. As disclosed, for example, in JP-A-2005-245053, such an input circuit receives a plurality of input signals as analog signals, converts the inputted analog signals to digital signals, and externally outputs the converted signals as AD (analog-to-digital) data signals.

Such an input circuit may sometimes cause a short-circuit fault between the input wirings or between the terminals through which input signals are inputted. Therefore, in order to constantly detect a short-circuit fault that would occur between the input wirings, the input circuit disclosed in JP-A-2005-245053 constantly makes a comparison as to whether or not the input signals are the same in line circuits, on the precondition that the characteristics of the signals inputted to one terminal should be different from those of the signals inputted to an adjacently located terminal.

Specifically, if there is no short-circuit fault, the signals inputted to one terminal are different from the signals inputted to an adjacently located terminal, but will be the same in the occurrence of a short-circuit fault. Accordingly, comparison of the input signals in the line circuits enables detection of the occurrence of a short-circuit fault.

On the other hand, there is a method of detecting the occurrence of a short-circuit fault with another signal terminal that can exhibit the same characteristics in a normal state. For example, this method uses a dual circuit having an input wiring that includes two lines to which the same input signals are inputted to constantly make a comparison as to whether the input signals are the same in the line circuits.

Specifically, if there is no short-circuit fault relative to other input signals, the input signals are the same in the dual circuit, but will be different in the occurrence of a short-circuit fault. Thus, comparison between the input signals in the dual circuit enables detection of the presence or absence of a short-circuit fault.

However, when a short-circuit fault is detected by using such a dual circuit, detection lines are required to be redundantly increased in addition to an originally required one line. Provision of such additional detection lines can complicate the circuit, and further, can increase the number of components, resultantly increasing cost incurred in manufacturing a product.

SUMMARY

An embodiment provides an input circuit which receives a plurality of input signals, without being provided with a dual circuit and without being based on the precondition that the signals inputted to the input terminals have mutually different characteristics, but which is able to constantly detect the occurrence of a short-circuit fault between the input wirings or between the terminals.

As an aspect of the embodiment, an input circuit is provided which has a plurality of input terminals connected to a plurality of input lines transmitting input signals outputted from a plurality of input signal sources. The input circuit includes: a controller which outputs a control signal when performing self-diagnosis of a short-circuit fault between the input lines; a pulse circuit which generates pulsed self-diagnosis voltage once, twice or more times based on a control signal of the controller; a switch which, when performing the self-diagnosis, applies the pulsed self-diagnosis voltage to any one of the input lines based on the control signal of the controller; and a comparing/determining section which, when the self-diagnosis voltage is applied to the any one of the input lines, determines whether the short-circuit fault between the input lines has occurred based on voltage variation in the input line different from the input line to which the self-diagnosis voltage is applied.

DETAILED DESCRIPTION OF THE PREFERRED EMBODIMENTS

Figure 1:
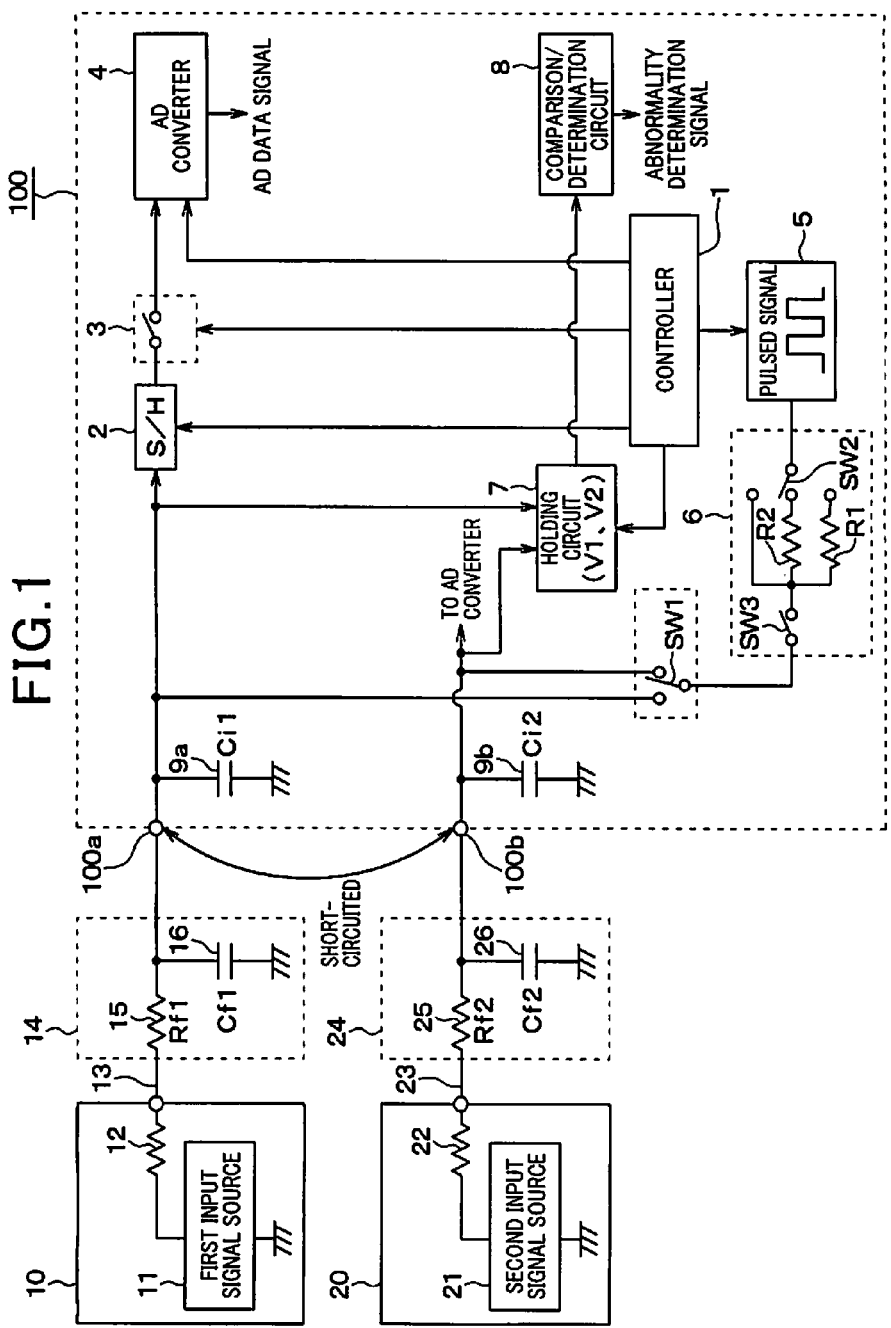
FIG. 1 is a diagram illustrating a circuit configuration of an input circuit according to a first embodiment of the present invention.

With reference to the accompanying drawings, hereinafter are described some embodiments of the present invention. It should be noted that, in the following embodiments, the components identical with or similar to each other between the embodiments are given the same reference numerals.

First Embodiment

Referring to FIGS. 1 to 5, the first embodiment of the present invention is described. FIG. 1 is a diagram illustrating a circuit configuration of an input circuit 100 according to the first embodiment. The input circuit 100 shown in FIG. 1 receives an input signal in the form of an analog signal, converts the analog signal into a digital signal (AD (analog-to-digital) conversion), and externally outputs the converted signal as an AD data signal. For example, as the input circuit 100, mention can be made of a sensor signal input circuit which is installed in a brake ECU (electronic control unit) to control brake fluid pressure. In this case, the input circuit 100 receives a sensor signal as an input signal that has been outputted from a sensor, such as a pressure sensor, an acceleration sensor (G sensor), or the like, performs AD conversion of the input signal, and outputs an AD data signal as a signal indicating the result of sensing.

As shown in FIG. 1, the input circuit 100 is connected to first and second input lines 13 and 23 through which the signals outputted from first and second sensors 10 and 20, respectively, are transmitted. The first and second sensors 10 and 20 respectively have first and second input signal sources 11 and 21 as well as output protective resistors 12 and 22. The output protective resistors 12 and 22 are connected to the first and second input signal sources 11 and 21, respectively. The signals generated by the first and second input signal sources 11 and 21 are outputted from the first and second sensors 10 and 20 through the output protective resistors 12 and 22, respectively. The signals outputted from the first and second sensors 10 and 20 are inputted, as input signals, to first and second input terminals 100a and 100b, respectively, of the input circuit 100.

The first and second input lines 13 and 23 are respectively provided with first and second filter circuits 14 and 24. Specifically, the first filter circuit 14 is provided to the first input line 13 so as to be located between the first sensor 10 and the first input terminal 100a. Similarly, the second filter circuit 24 is provided to the second input line 23 so as to be located between the second sensor 20 and the second input terminal 100b. The first and second filter circuits 14 and 24 are respectively provided with external resistors 15 and 25 as well as external capacitors 16 and 26 to thereby configure RC (resistor-capacitor) filters. Specifically, the external resistors 15 and 25 having respective resistances Rf1 and Rf2 are ensured to be serially connected to the first and second input lines 13 and 23, respectively, while the external capacitors 16 and 26 having respective capacitances Cf1 and Cf2 are ensured to be parallelly connected to the first and second input lines 13 and 23, respectively.

The input circuit 100 is configured by an IC (integrated circuit) and connected to the first and second input lines 13 and 23 via the first and second input terminals 100a and 100b, respectively. In the present embodiment, the input circuit 100 includes a controller 1, a sample-and-hold (hereinafter referred to as S/H) circuit 2, a control switch 3 and an AD converter 4. The S/H circuit 2, the control switch 3 and the AD converter 4 provide a configuration for outputting an AD data signal that is obtained by performing AD conversion of an input signal. As a configuration for abnormality detection, the input circuit 100 also includes a pulse circuit 5, a switch SW1, a first resistor-switch circuit 6, a first holding circuit 7 and a comparison/determination circuit 8.

The controller 1 outputs a control signal to the S/H circuit 2, the control switch 3 and the AD converter 4 provided to the input circuit 100. In response to the control signal, an input signal is AD-converted and outputted as an AD data signal at predetermined sampling periods. The controller 1 controls the pulse circuit 5, the switches SW1 and SW2, the first resistor-switch circuit 6, the first holding circuit 7 and the comparison/determination circuit 8. Under the control, self-diagnosis is performed as to the presence or absence of a short-circuit fault.

According to the control signal from the controller 1, the S/H circuit 2 samples and holds an input signal at desired sampling periods. The control switch 3 controls connection conditions between the S/H circuit 2 and the AD converter 4, and inputs the signal sampled and held by the S/H circuit 2 to the AD converter 4 at predetermined sampling periods. The AD converter 4 is incorporated such as with a plurality of comparators. In the AD converter 4, the input signals that have been sampled and held by the S/H circuit 2 and represented by analog signals are compared with each other in size by the plurality of comparators and converted to digital signals according to the results of the comparison, and are outputted as AD data signals.

The pulse circuit 5 generates a pulsed voltage (pulse signal) for self-diagnosis (hereinafter referred to as self-diagnosis voltage) on the basis of a control signal from the controller 1. As the self-diagnosis voltage, the pulse circuit 5 generates a predetermined pulsed voltage (e.g., pulsed voltage of 5V and 0V) once, or twice or more times at a short period. The self-diagnosis voltage generated by the pulse circuit 5 is applied to the first or second input line 13 or 23 via the first resistor-switch circuit 6.

The first resistor-switch circuit 6 is used for adjusting the impedance in applying the self-diagnosis voltage to the first or second input line 13 or 23, and thus changes the resistance between the pulse circuit 5 and the first or second input line 13 or 23. Specifically, the first resistor-switch circuit 6 is configured by switches SW2 and SW3 as well as first and second resistors R1 and R2. When applying the self-diagnosis voltage to the first or second input line 13 or 23, the first resistor-switch circuit 6 switches a mode of directly applying the self-diagnosis voltage to a line, to a mode of applying the self-diagnosis voltage to a line via the first or second resistor R1 or R2, or vice versa. Being provided with the first and second resistors R1 and R2, the first resistor-switch circuit 6 is permitted to possess general versatility with respect to the first and second filter circuits 14 and 24. The first and second resistors R1 and R2 are set to different resistances, which are appropriately selected inconformity with the impedance of the filter circuits 14 and 24.

Specifically, the allowable range of the resistance with which the first resistor-switch circuit 6 can be connected to the first or second input line 13 or 23 depends on the resistances Rf1 and Rf2 of the respective external resistors 15 and 25, and the capacitances Cf1 and Cf2 of the respective external capacitors 16 and 26. For this reason, which one of the first and second resistors R1 and R2 should be used or whether neither of them should be used is selected on the basis of the resistances Rf1 and Rf2 and the capacitances Cf1 and Cf2. The switch SW2 is switched so that the self-diagnosis voltage is inputted to the first or second input line 13 or 23 via either one of the first and second resistors R1 and R2 as selected, or directly inputted when neither of them is selected. When the switch SW3 is turned on, the pulsed signal is ensured to be applied to the first or second input line 13 or 23 via a path of a resistance selected by the switch SW2.

The switch SW1 controls application of the self-diagnosis voltage to the first or second input line 13 or 23. Specifically, the switch SW1 is timely turned on when the self-diagnosis voltage is generated by the pulse circuit 5. The switch SW1 performs switching so that the pulsed signal is applied to either one of the first and second input lines 13 and 23 via the first resistor-switch circuit 6.

Upon input of a control signal from the controller 1 at a holding timing, the first holding circuit 7 holds the voltage of the first or second input line 13 or 23 on the basis of the control signal. The holding timing corresponds to the fall of the pulsed self-diagnosis voltage formed by the pulse circuit 5 or the end of H voltage, and the rise of the pulsed voltage or the end of L voltage. The first holding circuit 7 holds the voltage of the first or second input line 13 or 23 at these timings, as a first voltage V1 or a second voltage V2, respectively.

The comparison/determination circuit 8 corresponds to a comparing/determining means (section). The comparison/determination circuit 8 receives the first and second voltages V1 and V2 held by the first holding circuit 7 and makes a determination as to the occurrence of a short-circuit fault on the basis of the voltage variation from the first voltage V1 to the second voltage V2 to thereby output an abnormality determination signal according to the results of the determination. Specifically, the comparison/determination circuit 8 calculates a difference between the first and second voltages V1 and V2 as expressed by V1–V2, while determining whether the difference V1–V2 is not more than a predetermined threshold Th. If the difference V1–V2 is not more than the threshold Th, the comparison/determination circuit 8 determines the input circuit 100 as being in a normal state, but if exceeds the threshold Th, determines a shot-circuit fault as having occurred. Then, the comparison/determination circuit 8 outputs an abnormality determination signal that indicates the input circuit 100 as being in a normal state or as having a short-circuit fault.

As described above, the input circuit 100 of the present embodiment has a configuration in which the first and second filter circuits 14 and 24 are connected to the first and second input lines 13 and 23, respectively, through which an input signal is transmitted. The input circuit 100 configured as described above performs AD conversion of an input signal and then outputs an AD data signal, while outputting an abnormality determination signal that indicates a result of determination as to the occurrence of a short-circuit fault. Thus, the input circuit 100 outputs the AD data signal and the abnormality determination signal to an externally provided control unit or the like. Accordingly, the control unit is able to obtain, for example, the results of the sensing performed by the first and second sensors 10 and 20, as well as the results of the determination as to the occurrence of a short-circuit fault between the first and second input lines 13 and 23. In this way, the control unit is able to perform various controls including brake control on the basis of the results of the sensing, or take measures such as of stopping intervention of various controls in the event that a short-circuit fault has occurred.

FIG. 1 omits the illustration of an input circuit for transmitting the sensor signal of the second sensor 20, which should be drawn from the second input line 23 to the AD converter 4. The omitted input circuit is configured similar to the input circuit for transmitting the sensor signal of the first sensor 10, which is drawn from the first input line 13 to the AD converter. Specifically, the input circuit from the second input line 23 to the AD converter 4 also includes components similar to the S/H circuit 2 and the control switch 3. The sensor signals of the first and second sensors 10 and 20 are ensured to be inputted to the AD converter 4 at different sampling timing, and be converted to AD data signals by the AD converter 4. The input circuit 100 includes capacitors 9a and 9b which are connected to the first and second input terminals 100a and 100b, respectively. The capacitors 9a and 9b are parasitic capacitors having capacitances Ci1 and Ci2 which are sufficiently smaller than the capacitances Cf1 and Cf2, respectively, of the external capacitors 16 and 26.

Referring to time diagrams shown in FIGS. 2 to 6, hereinafter are described the details of a self-diagnostic method performed by the input circuit 100 which is configured as described above.

Figure 2:
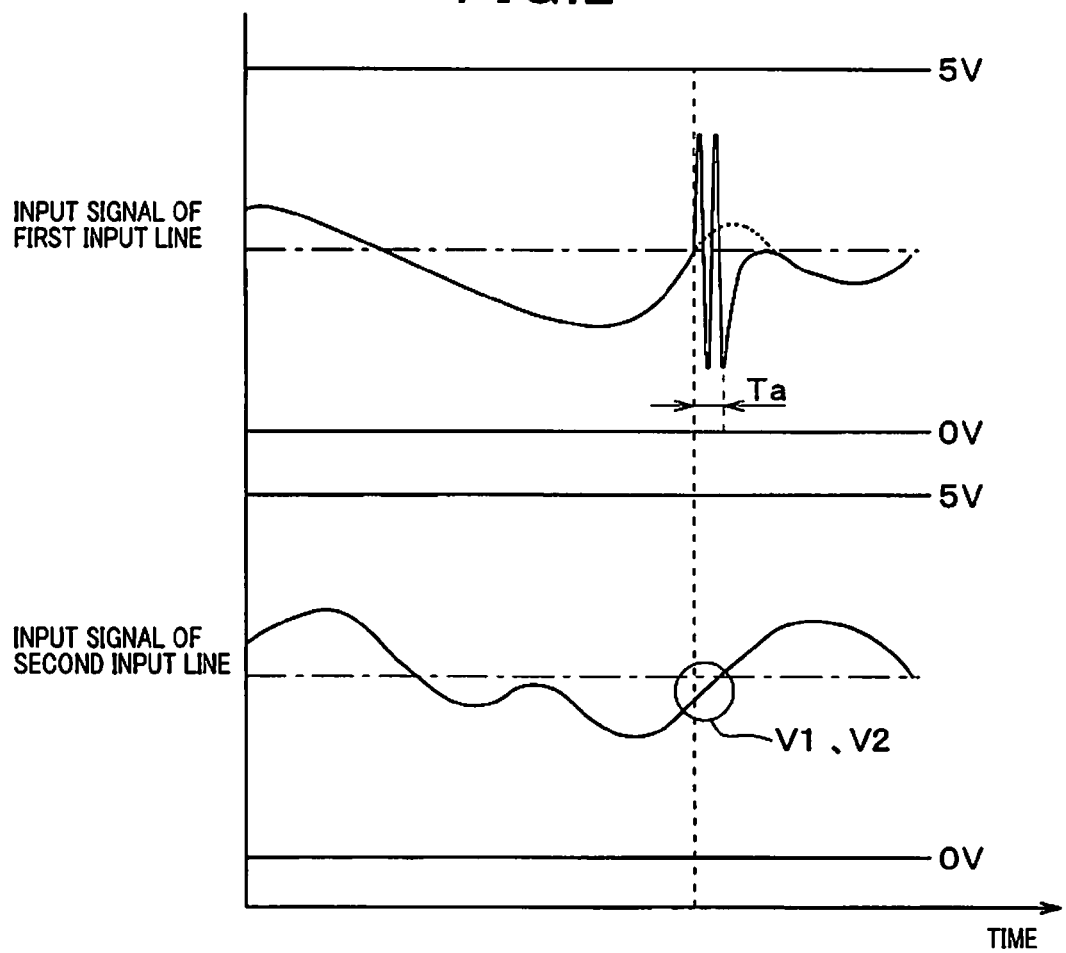
FIG. 2 is a time diagram illustrating an example of input signals of input lines in a normal state, and voltage variations in the input lines in performing self-diagnosis.

As shown in FIG. 2, the first and second sensors 10 and 20 generate predetermined input signals represented by analog signals. For example, when the first and second sensors 10 and 20 are a sensor mounted to a vehicle to control brake fluid pressure, and the like, these sensors generate sensor signals as input signals within a range of 0V to 5V according to the results of sensing.

In a normal state that is not a self-diagnosis state, an input signal is sampled at predetermined sampling periods by the S/H circuit 2, while the input signal is inputted to the AD converter 4 via the control switch 3. Thus, the input signal is AD-converted by the AD converter 4 and a resultant AD data signal is outputted from the AD converter 4.

As shown in FIG. 2 by a period Ta, in a self-diagnosis state, the switches SW1 and SW2 are switched according to a control signal from the controller 1, while a pulsed self-diagnosis voltage is generated by the pulse circuit 5. Thus, a self-diagnosis voltage is sequentially applied to the first and second input lines 13 and 23 to thereby determine whether the first and second input lines 13 and 23 are in a normal state or whether a short-circuit fault has occurred between the lines.

For example, when the first line 13 connected to the first sensor 10 is self-diagnosed, the switch SW1 is connected to a contact terminal to be connected to the first input line 13, while the switch SW2 is switched and the switch SW3 is turned on. Thus, a self-diagnosis voltage is applied to the first input line 13 in a mode selected by the switch SW2, i.e. directly, or via the first or second resistor R1 or R2. In accordance with the self-diagnosis voltage, the voltage of the first input line 13 (first input terminal 100a) varies.

Figure 3:
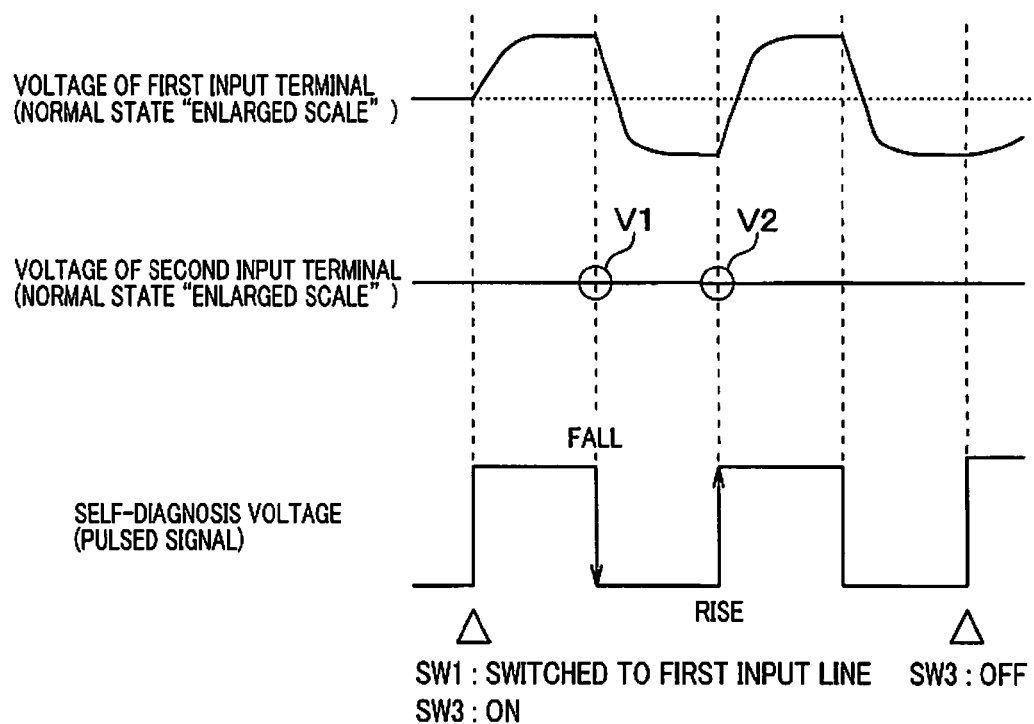
FIG. 3 is a time diagram illustrating voltages for self-diagnosis outputted from a pulse circuit in performing self-diagnosis in a normal state, and voltage variations of the input terminals (input lines)

In this case, if no short-circuit fault has occurred between the first and second input lines 13 and 23, the first and second input lines 13 and 23 have mutually independent voltages. Specifically, the first input line 13 has a voltage according to the self-diagnosis voltage, while the second input line 23 has a voltage according to the output of the second sensor 20. Thus, as shown in FIGS. 2 and 3, the voltage of the first input terminal 100a becomes a pulsed voltage according to the pulsed self-diagnosis voltage. On the other hand, the voltage of the second input terminal 100b hardly varies in such a short duration of time as when the self-diagnosis voltage is applied to the first input line 13. In other words, the input signal hardly varies when the duration of time of applying a self-diagnosis voltage is short relative to the variation period of the sensor signal of the second sensor 20 and the filter characteristics of the filter circuit 24.

Figure 4:
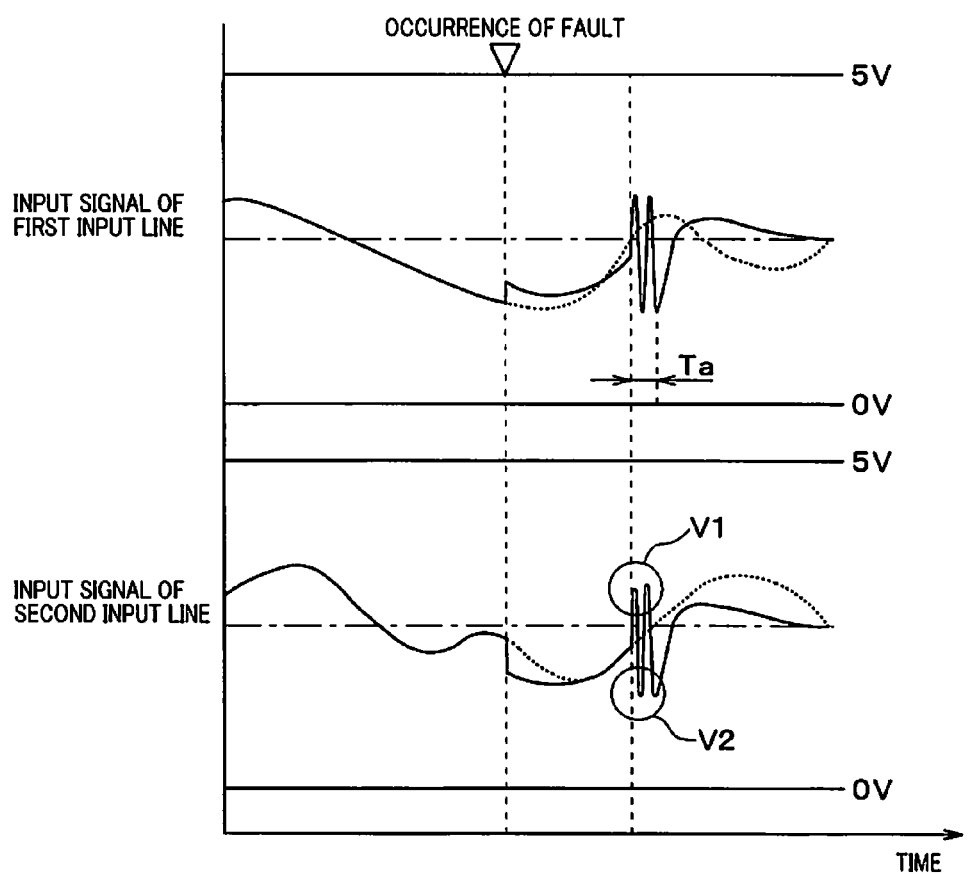
FIG. 4 is a time diagram illustrating an example of input signals of the input lines in an abnormal state, and voltage variations in the input lines in performing self-diagnosis.
Figure 5:
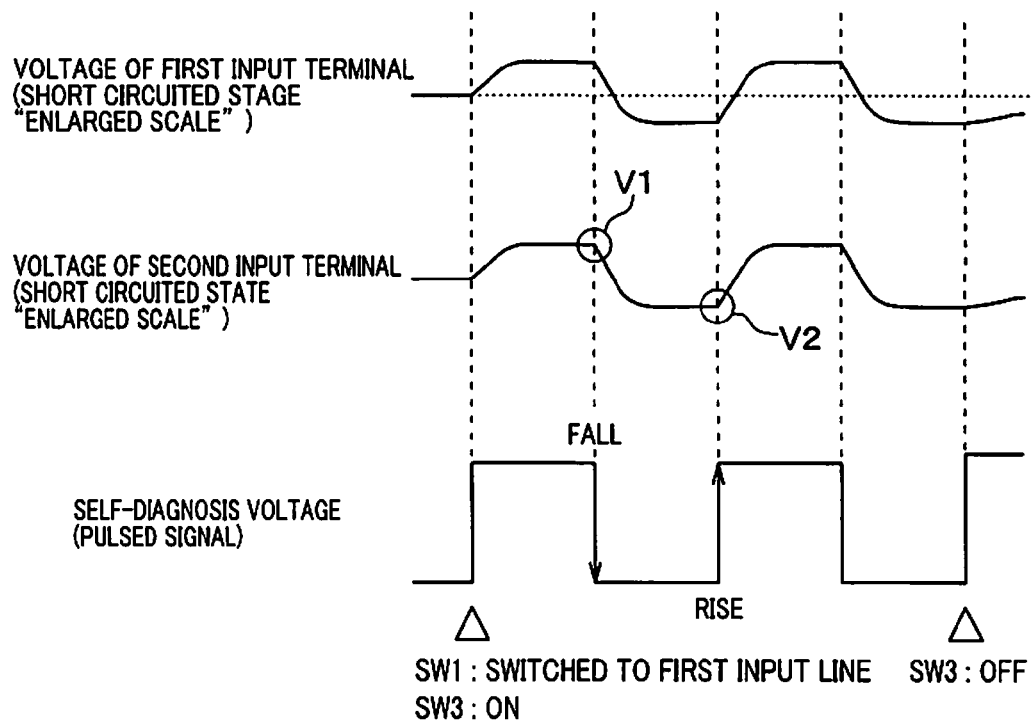
FIG. 5 is a time diagram illustrating voltages for self-diagnosis outputted from the pulse circuit in performing self-diagnosis in an abnormal state, and voltage variations of the input terminals (input lines)

On the other hand, when a short-circuit fault has occurred between the first and second input lines 13 and 23, the first and second input lines 13 and 23 have an equal voltage, and thus have a voltage according to the self-diagnosis voltage. In other words, as shown in FIGS. 4 and 5, the voltages of the first and second input terminals 100a and 100b are pulsed according to the pulsed self-diagnosis voltage. However, the self-diagnosis voltage is applied to both of the first and second input lines 13 and 23 which are connected in parallel to each other. Accordingly, while the voltages of the first and second input terminals 100a and 100b are pulsed, their rate of change is small compared to the case where there is no short-circuit fault.

Accordingly, the voltages of the second input terminal 100b at the fall of the pulsed voltage or the end of H voltage, and at the rise of the pulsed voltage or the end of L voltage are rendered to be the first and second voltages V1 and V2, respectively, and these first and second voltages V1 and V2 are held to obtain the difference V1−V2.

Specifically, if a short-circuit fault has occurred, the first voltage V1 at the fall of a first pulse is a voltage when the voltage of the second input terminal 100b is maximized with the application of the first pulse thereto, on the basis of the applied self-diagnosis voltage. Further, if a short-circuit fault has occurred, the second voltage V2 at the rise of a second pulse is a voltage when the voltage of the second input terminal 100b is minimized, following convergence of the voltage rise in the second input terminal 100b caused by the application of the first pulse. Accordingly, the difference V1−V2 between the first voltage V1 at the fall of the first pulse and the second voltage V2 at the rise of the second pulse has a small value in a normal state where there is no short-circuit fault, but has a large value in the occurrence of a short-circuit fault. Thus, when the difference V1−V2 is not more than the threshold Th as a result of the comparison therebetween, the input circuit 100 is determined to be in a normal state, but is determined to have a short-circuit fault when the difference V1−V2 exceeds the threshold Th.

The same applies to the case where a self-diagnosis voltage is applied to the second input line 23 which is connected to the second sensor 20. The switch SW1 is connected to a contact terminal to be connected to the second input line 20, while the switch SW2 is properly switched and the switch SW3 is turned on. Further, the voltages of the first input terminal 100a at the fall of the pulsed self-diagnosis voltage or the end of H voltage, and at the rise of the pulsed voltage or the end of L voltage are rendered to be the first and second voltages V1 and V2, respectively, and these first and second voltages V1 and V2 are held to obtain the difference V1−V2. Then, the difference V1−V2 is compared with the threshold Th. When the difference V1−V2 is not more than the predetermined threshold Th as a result of the comparison, the input circuit 100 is determined to be in a normal state, but is determined to have a short-circuit fault when the difference V1−V2 exceeds the threshold Th.

Figure 6:
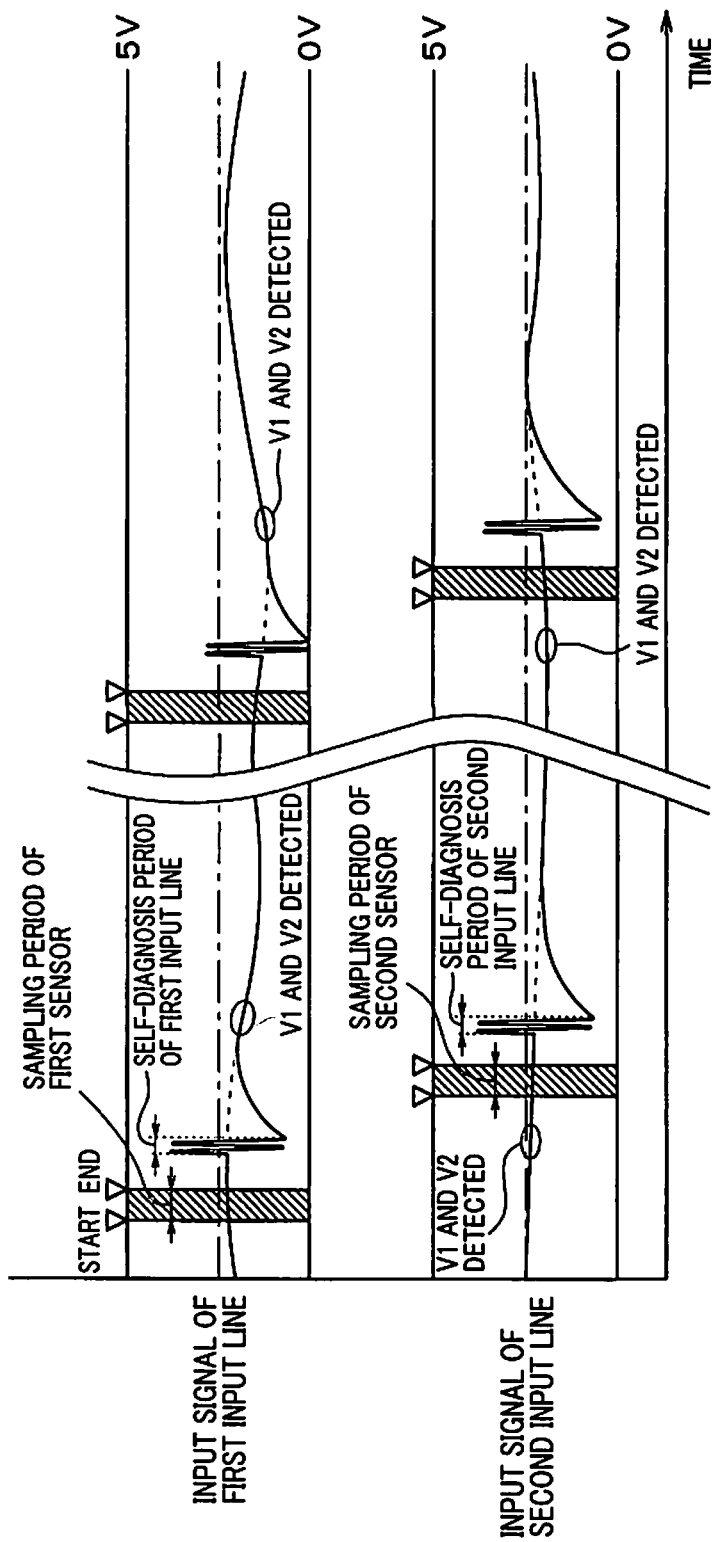
FIG. 6 is a time diagram illustrating voltage variations of the input terminals (input lines) including a state of sampling of sensors and a state of self-diagnosis.

Such self-diagnosis performed at a desired timing as described above enables detection of the occurrence of a short-circuit fault. Thus, erroneous results of sensing derived from the first and second sensors 10 and 20 under the condition where there is a short-circuit fault are prevented from being used as bases for performing various controls. For example, as shown in FIG. 6, self-diagnosis for short-circuit faults is performed at every sampling timing. Specifically, in a period from one sampling to the subsequent sampling with the first sensor 10, a self-diagnosis voltage can be applied to the first input line 13 at a timing excepting a period of sampling with the second sensor 20. Further, in a period from one sampling to the subsequent sampling with the second sensor 20, a self-diagnosis voltage can be applied to the second input line 23 at a timing excepting a period of sampling with the first sensor 10. In this way, a self-diagnosis voltage is sequentially applied to the first and second input lines 13 and 23 to constantly enable determination as to the occurrence of a short-circuit fault.

As described above, a pulsed self-diagnosis voltage generated by the pulse circuit 5 is applied to either one of the first and second input lines 13 and 23. Also, the difference V1−V2 between the first and second voltages V1 and V2 is ensured to be obtained, in respect of the other of the first and second input lines 13 and 23, at the fall of a pulsed voltage or at the end of H voltage, and at the rise of the pulsed voltage or at the end of L voltage. Then, the difference V1−V2 is ensured to be compared with the threshold Th. Thus, the presence or absence of a short-circuit fault can be self-diagnosed. Accordingly, in the input circuit 100 to which a plurality of input signals are inputted, a short-circuit fault can be detected between the input wirings without the necessity of providing dual circuit.

Second Embodiment

Figure 7:
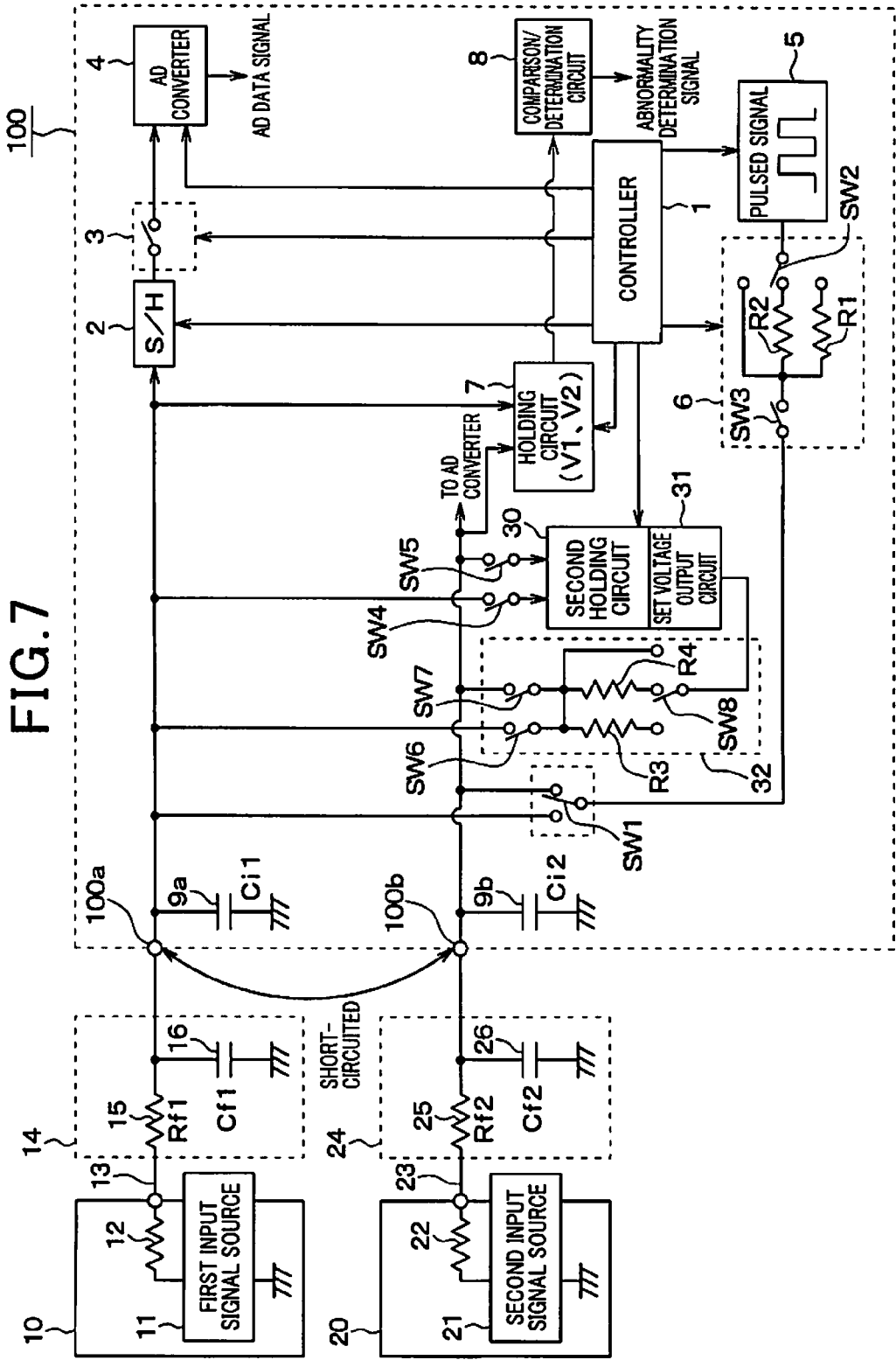
FIG. 7 is a diagram illustrating a circuit configuration of an input circuit according to a second embodiment of the present invention.
Figure 8:
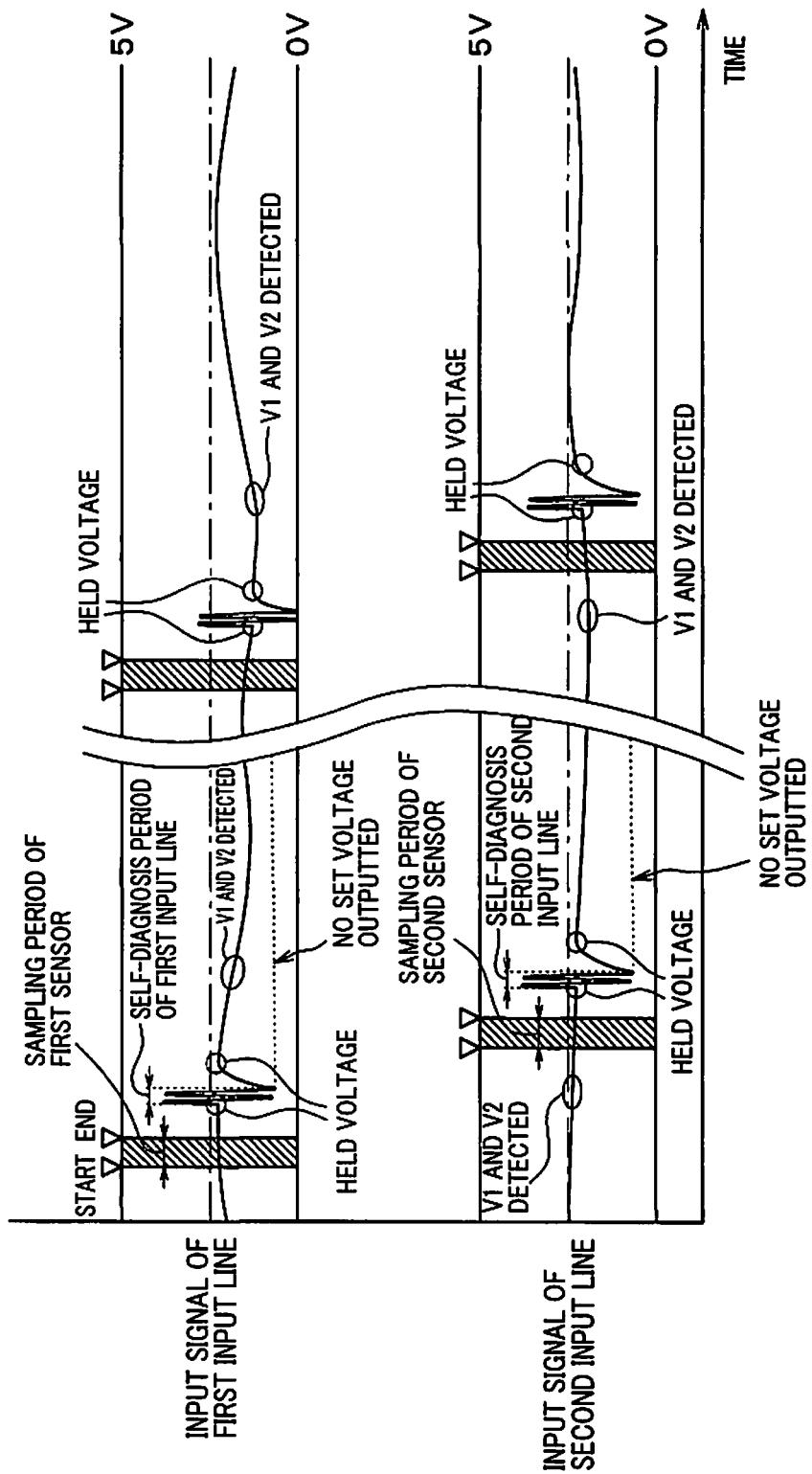
FIG. 8 is a time diagram illustrating voltage variations of input terminals (input lines) including a state of sampling of sensors and a state of self-diagnosis, according to the second embodiment.

Referring now to FIGS. 7 and 8, a second embodiment of the present invention is described. The second embodiment is different from the first embodiment in that the input circuit 100 is additionally provided with a voltage adjustment function which is performed after self-diagnosis. Since the rest of the configuration is similar to the first embodiment, the following description is focused on the difference from the first embodiment.

As described above, in performing self-diagnosis, the presence or absence of a short-circuit fault can be determined by applying a self-diagnosis voltage to either of the first and second input lines 13 and 23. However, being influenced by the external resistors 15 and 25 provided to the filter circuits 14 and 24, respectively, a delay time is caused according to a time constant. The delay time is caused before restoration of the voltage indicated by the AD data signal, which is outputted from the AD converter 4 after the self-diagnostic operation, to the voltage indicated by the sensor signal. The delay time varies depending on the resistances of the external resistors 15 and 25, and may sometimes be long. Therefore, when the presence or absence of a short-circuit fault is constantly determined, AD conversion has to be halted while the voltage indicated by the AD data signal is restored to the voltage indicated by the sensor signal. This may lead to a problem of disabling short-cycle sampling.

In this regard, when self-diagnosis is performed in the present embodiment, the voltage before self-diagnosis is held for the input line to which a self-diagnosis voltage is applied, and the voltage that has been held is restored, after completion of the self-diagnosis, as a voltage of the input line. Thus, AD conversion does not have to be halted during the period when the voltage indicated by the AD data signal is restored to the voltage indicated by the sensor signal, thereby enabling short-period sampling.

FIG. 7 is a diagram illustrating a circuit configuration of an input circuit 100 according to the second embodiment. As shown in FIG. 7, the input circuit 100 of the present embodiment is configured to include a second holding circuit 30, a set voltage output circuit 31, and a second resistor-switch circuit 32, in addition to the components described in the first embodiment.

The second holding circuit 30 is controlled by a control signal of the controller 1 to hold the voltage of whichever of the first and second input lines 13 and 23 to which a self-diagnosis voltage is applied, i.e. to hold the voltage indicated by the sensor signal. Specifically, the second holding circuit 30 holds the voltage of the first or second input line 13 or 23 when a switch SW4 or a switch SW5 is turned on. The switches SW4 and SW5 are also controlled by the control signal of the controller 1. According to the control signal of the controller 1, in performing self-diagnosis, either the switch SW4 or the switch SW5 is selected and turned on so that the voltage of the input line to which a self-diagnosis voltage is applied is held by the second holding circuit 30.

After completing self-diagnosis, the set voltage output circuit 31 outputs the voltage held by the second holding circuit 30 (hereinafter is referred to as held voltage). Specifically, the set voltage output circuit 31 applies the held voltage to the first or second input line 13 or 23 via the second resistor-switch circuit 32.

The second resistor-switch circuit 32 is used for adjusting impedance in applying the held voltage to the first or second input line 13 or 23. Specifically, the second resistor-switch circuit 32 changes the resistance between the set voltage output circuit 31 and the first or second input line 13 or 23 to adjust the impedance. More specifically, when a switch SW6 or a switch SW7 is turned on, the second resistor-switch circuit 32 switches mode, according to a selection made by a switch SW8, between a mode of directly applying the held voltage and a mode of applying the held voltage via a third resistor R3 or a fourth resistor R4. The third and fourth resistors R3 and R4 are provided to restore the voltage of the first or second input line at an earlier stage to the voltage before self-diagnosis, which voltage is approximate to the voltage indicated by the sensor signal and, at the same time, to suppress noises induced by the voltage variation of the first or second input line 13 or 23. The third and fourth resistors R3 and R4 are ensured to have a different resistance and are appropriately selected according to the impedance of the filter circuit 14 or 24.

Specifically, there is a favorable range of resistance for the early-stage restoration of the voltage indicated by the sensor signal or for the suppression of noises, when the second resistor-switch circuit 32 is connected to the first or second input line 13 or 23. Such a favorable range of resistance depends on the resistance Rf1 or Rf2 of the external resistor 15 or 25, and the capacitance Cf1 or Cf2 of the external capacitor 16 or 26. Thus, based on the resistance Rf1 or Rf2, and the capacitance Cf1 or Cf2, a selection is made that the third or fourth resistor R3 or R4 should be used, or that neither of them should be used. The switch SW8 is switched so that the held voltage is inputted to the first or second input line 13 or 23 via whichever of the third and fourth resistors R3 and R4 that is selected to be used, or inputted thereto directly when neither of them is selected to be used.

The input circuit 100 of the present embodiment is configured as described above. The following are the details of a self-diagnosis method performed by the input circuit 100 of the present embodiment. The basic self-diagnosis method of the present embodiment is similar to that of the first embodiment, except the voltage adjustment performed after self-diagnosis. Therefore, the following description is focused on the voltage adjustment performed after self-diagnosis.

As shown in a time diagram illustrated in FIG. 8, when self-diagnosis is performed for the first sensor 10 following sampling of a sensor signal thereof, the controller 1 controls the switches SW1 to SW3. Under the control, a self-diagnosis voltage is applied to the first input line 13. Thus, based on the method described in the first embodiment, a determination is made as to the occurrence of a short-circuit fault between the first and second input lines 13 and 23.

In this case, the switch SW4 is turned on immediately before the self-diagnosis to have the second holding circuit 30 held the voltage of the first input line 13 immediately before the self-diagnosis. Then, after completing the self-diagnosis, the switch SW4 is turned off. At the same time, the switch SW6 is turned on in the second resistor-switch circuit 32, and the resistor R3 or R4, or non-resistor is selected by the switch SW8. Thus, the held voltage of the second holding circuit 30 is outputted from the set voltage output circuit 31, and the outputted voltage is applied to the first input line 13 via the second resistor-switch circuit 32.

Accordingly, as indicated by a broken line in FIG. 7, depending on the resistance of the external resistor 15, if no held voltage is inputted, the voltage of the first input line 13 may be restored only slowly after the sensor signal of the first sensor 10 is inputted again upon completion of the self-diagnosis. However, when the held voltage is ensured to be inputted as in the present embodiment, the voltage of the first input line 13 is rapidly restored to the voltage at the start of the self-diagnosis, after completion of the self-diagnosis. Thus, the AD conversion is not required to be halted during a period when the voltage indicated by the AD data signal is restored to the voltage indicated by the sensor signal, thereby enabling short-period sampling.

Then, the switch SW6 is turned off after completion of the self-diagnosis, and after lapse of a time which is estimated to be taken for the voltage indicated by the AD data signal to be restored to the voltage indicated by the sensor signal. Thus, at the subsequent sampling, a sensor signal can again be ensured to be AD-converted by the AD converter 4 and outputted as an AD data signal.

The same process described above applies to the case where the presence or absence of a short-circuit fault is self-diagnosed for the second line 23 following sampling of a sensor signal of the second sensor 20. Thus, the voltage of the second input line 20 is also rapidly restored to the voltage at the start of the self-diagnosis, when a sensor signal of the second sensor 20 is inputted again upon completion of the self-diagnosis. Thus, the AD conversion no longer has to be halted during a period when the voltage indicated by the AD data signal is restored to the voltage indicated by the sensor signal, thereby in enabling short-period sampling.

Other Embodiments

The present invention should not be construed as being limited to the foregoing embodiments, but may be appropriately modified within a scope of the claims.

For example, the signal generated by the pulse circuit 5 is a rectangular wave pulse, however, instead, a triangular wave pulse or a sine wave pulse may be used. When a triangular wave voltage is generated as in the case of a pulsed current source or a triangular wave voltage source, the voltage may be held and detected at the switching timing at the fall and rise of the pulsed voltage, similar to the rectangular wave pulse, or maximum and minimum values of a wave height at the time of applying pulse may be detected by peak detection, followed by comparison for the detection of a short circuit. In the case of a sine wave pulse as well, maximum and minimum values of a wave height at the time of applying pulse may be detected by peak detection, followed by comparison for the detection of a short circuit.

In the foregoing embodiments, the difference V1−V2 between the first and second voltages V1 and V2 is ensured to be compared with the threshold Th in self-diagnosing the presence or absence of a short-circuit fault. The first and second voltages V1 and V2 are derived at the fall of a pulsed signal applied from the pulse circuit 5 or at the end of H voltage, and at the rise of the pulsed voltage or at the end of L voltage. However, this is only an example. Another method may be used, which is based on the voltage variation of the second voltage V2 relative to the first voltage V1. For example, a rate of change from the first voltage V1 to the second voltage V2 may be compared with a threshold to thereby diagnose the presence or absence of a short-circuit fault.

In the foregoing embodiments, the first and second voltages V1 and V2 correspond to the voltages at the fall of a pulsed signal or at the end of H voltage, and at the rise of the pulsed voltage or at the end of L voltage, respectively. Alternatively, the first and second voltages V1 and V2 may be the voltages after lapse of a predetermined time from H output and L output, respectively, of a pulsed signal. Thus, the difference V1−V2 may be compared with the threshold Th.

Specifically, the first and second voltages V1 and V2 may be held at the timing synchronizing with H/L variation of a pulsed signal, and then the difference V1−V2 may be compared with the threshold Th to make a determination as to the occurrence of a short-circuit fault. Thus, the timing of obtaining the first and second voltages V1 and V2 may be any timing.

The foregoing embodiments describe a mode of inputting two input signals of the first and second sensors 10 and 20 to the input circuit 100. However, the mode should not be construed as being limited to the mode of the two input signals, but the present invention may be applied to a mode of an input circuit to which input signals are inputted via a plurality of input lines. In this case, a self-diagnosis voltage may be applied to optional one of the plurality of input lines, while the difference V1−V2 between the first and second voltages V1 and V2 may be obtained for the rest of the plurality of input lines to compare the difference with the threshold Th. In this case, the input lines as targets of acquiring the difference V1−V2 between the first and second voltages V1 and V2 can basically be all the input lines except the input line to which the self-diagnosis voltage is applied. However, since the number of the input lines as targets of acquiring the difference V1−V2 is large, only those adjacent input lines which are estimated to easily cause a short-circuit fault may be used as targets of acquiring the difference V1−V2.

In the foregoing embodiments, the input circuit 100 is ensured to have an AD conversion function that AD-converts an input signal to externally output the AD-converted signal as an AD data signal. However, the input circuit 100 may have another function of processing an input signal to externally output the processed signal.

In the foregoing embodiments, the first and second resistors R1 and R2 are provided to give general versatility to the input circuit 100. Thus, the switch SW2 is ensured to select either of the first and second resistors R1 and R2, or select non-resistor so that the pulse circuit 5 is connected to the first or second input line 13 or 23. Similarly, the input circuit 100 includes the third and fourth resistors R3 and R4. In this case, the switch SW8 is ensured to select either of the third and fourth resistors R3 and R4, or select non-resistor so that the set voltage output circuit 31 is connected to the first or second input line 13 or 23. Alternatively to this, however, the input circuit 100 may include a single resistor, or may include three or more resistors.

In the foregoing embodiments, the first resistor-switch circuit 6 is provided with the switch SW3 so that connection/disconnection of the pulse circuit 5 to/from the first or second input line 13 or 23 is ensured to be controlled by turning on/off the switch SW3. In contrast, the switch SW1 may be provided with a terminal which is connected to neither of the first and second input lines 13 and 23, in addition to the terminals for establishing connection with the first and second input lines 13 and 23. In this case, connection/disconnection of the pulse circuit 5 to/from the first or second input line 13 or 23 may be controlled by turning on/off the switch SW1.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

An input circuit which has a plurality of input terminals (100*a*, 100*b*) connected to a plurality of input lines (13, 23) transmitting input signals outputted from a plurality of input signal sources (11, 21). The input circuit includes: a controller (1) which outputs a control signal when performing self-diagnosis of a short-circuit fault between the input lines; a pulse circuit (5) which generates pulsed self-diagnosis voltage once, twice or more times based on a control signal of the controller; a switch (SW1, SW3) which, when performing the self-diagnosis, applies the pulsed self-diagnosis voltage to any one of the input lines based on the control signal of the controller; and a comparing/determining section (8) which, when the self-diagnosis voltage is applied to the any one of the input lines, determines whether the short-circuit fault between the input lines has occurred based on voltage variation in the input line different from the input line to which the self-diagnosis voltage is applied.

In this way, a pulsed self-diagnosis voltage generated by the pulse circuit is applied to any one of the plurality of input lines. In respect of those input lines which are not applied with the self-diagnosis voltage among the plurality of input lines, voltage variation is ensured to be obtained at the fall of the pulsed voltage or at the end of H voltage, and at the rise of the pulsed voltage or at the end of L voltage. The voltage variation is larger, when a short-circuit fault occurs, compared to a normal state where there is no short-circuit fault. Based on this, the presence or absence of a short-circuit fault can be self-diagnosed. Accordingly, in an input circuit to which a plurality of input signals are inputted, a short-circuit fault can be detected between input wirings or between terminals without the necessity of providing a dual circuit.

What is claimed is:

1. An input circuit which has a plurality of input terminals connected to a plurality of input lines transmitting an input signal outputted from a plurality of input signal sources, the input circuit comprising:
    a controller which outputs a control signal when performing self-diagnosis of a short-circuit fault between the input lines;
    a pulse circuit which generates pulsed self-diagnosis voltage once, twice or more times based on the control signal of the controller;
    a switch which, when performing the self-diagnosis, applies the pulsed self-diagnosis voltage to only one of the input lines based on the control signal of the controller; and
    a comparing/determining circuit which, when the self-diagnosis voltage is applied to the only one of the input lines, determines whether the short-circuit fault between the input lines has occurred based on voltage variation in the input line different from the input line to which the self-diagnosis voltage is applied.

2. The input circuit according to claim 1, further comprising a first holding circuit which holds a first voltage of the input line, which is different from the input line to which the self-diagnosis voltage is applied, and a second voltage of the input line, which is different from the input line to which the self-diagnosis voltage is applied, at timings synchronizing with high/low variation of the pulsed self-diagnosis voltage, based on the control signal of the controller, wherein the comparing/determining circuit calculates a difference between the first voltage and the second voltage based on the control signal of the controller, and the comparing/determining circuit determines occurrence of the short-circuit fault when the difference is more than a predetermined threshold and determines a normal state when the difference is not more than the threshold.

3. The input circuit according to claim 1, further comprising a first resistor-switch circuit which changes a resistance between the pulse circuit and the input line to which the self-diagnosis voltage is applied.

4. The input circuit according to claim 1, further comprising:

a second holding circuit which holds a voltage, obtained before the self-diagnosis, of the input line to which the self-diagnosis voltage is applied; and a set voltage output circuit which, after the self-diagnosis, outputs the voltage held by the second holding circuit to the input line to which the self-diagnosis voltage is applied.

5. The input circuit according to claim 4, further comprising a second resistor-switch circuit which changes a resistance between the set voltage output circuit and the input line to which the self-diagnosis voltage is applied.

6. The input circuit according to claim 1, wherein the input circuit is configured by an integrated circuit.

* * * * *

UNITED STATES PATENT AND TRADEMARK OFFICE
CERTIFICATE OF CORRECTION

PATENT NO. : 9,739,822 B2  
APPLICATION NO. : 14/661291  
DATED : August 22, 2017  
INVENTOR(S) : Ken Onodera Page 1 of 1

It is certified that error appears in the above-identified patent and that said Letters Patent is hereby corrected as shown below:

On the Title Page

At Column 1, (71) Applicants, Line number 2, delete "Advics Co., Ltd.," and insert -- ADVICS CO., LTD. --;

At Column 1, (73) Assignees, Line numbers 2-3, delete "ADVICS CO LTD, Kariya (JP)" and insert -- ADVICS CO., LTD., Kariya, Aichi-pref. (JP) --.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*